(12) United States Patent
Miyazaki et al.

(10) Patent No.: US 7,580,268 B2
(45) Date of Patent: Aug. 25, 2009

(54) BUILT-IN CAPACITOR TYPE POWER FEED DEVICE TO POWER PINS OF ELECTRICAL COMPONENT

(75) Inventors: Takehide Miyazaki, Kawasaki (JP); Hirofumi Imabayashi, Kawasaki (JP); Katsumi Kanasaki, Kawasaki (JP); Akira Okada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/316,862

(22) Filed: Dec. 27, 2005

(65) Prior Publication Data

US 2007/0076388 A1    Apr. 5, 2007

(30) Foreign Application Priority Data

Sep. 30, 2005    (JP)    ............... 2005-286867

(51) Int. Cl.
  *H05K 7/00*    (2006.01)
(52) U.S. Cl. ........................ 361/760; 361/794
(58) Field of Classification Search ................ 257/773; 361/760, 794
  See application file for complete search history.

(56) References Cited

U.S. PATENT DOCUMENTS

2003/0197198 A1*  10/2003  Panella et al. ............... 257/200
2004/0183209 A1*   9/2004  Lin ............................. 257/778
2005/0024840 A1*   2/2005  Smith et al. .................. 361/803
2005/0146017 A1*   7/2005  Koide ........................... 257/698
2007/0004240 A1*   1/2007  Dibene et al. ................. 439/66
2007/0075431 A1*   4/2007  Miyazaki et al. ............. 257/773

FOREIGN PATENT DOCUMENTS

JP    2-3957    1/1990
JP    6-223632    8/1994
JP    7-120227    12/1995

* cited by examiner

*Primary Examiner*—Dean A. Reichard
*Assistant Examiner*—Abiy Getachew
(74) *Attorney, Agent, or Firm*—Staas & Halsey LLP

(57) ABSTRACT

A built-in capacitor type power feed device for an electrical component which solves the problems of the reduction in the noise margin of the power supply system accompanying the lower drive voltages of electrical components and the noise between the power supply and ground accompanying simultaneous switching waveforms, provided with a power supply for supplying power, a printed circuit board including a signal line pattern, a power bar having conductive projections provided in shapes and at positions corresponding to the shapes and positions of electrodes of the electrical component and provided outside of the printed circuit board, a ground bar provided outside of the printed circuit board, and a high dielectric layer provided at a part corresponding to the electrical component between the power bar and the ground bar, power from the power supply being fed to electrodes of the electrical component through the power bar and the ground bar.

4 Claims, 8 Drawing Sheets

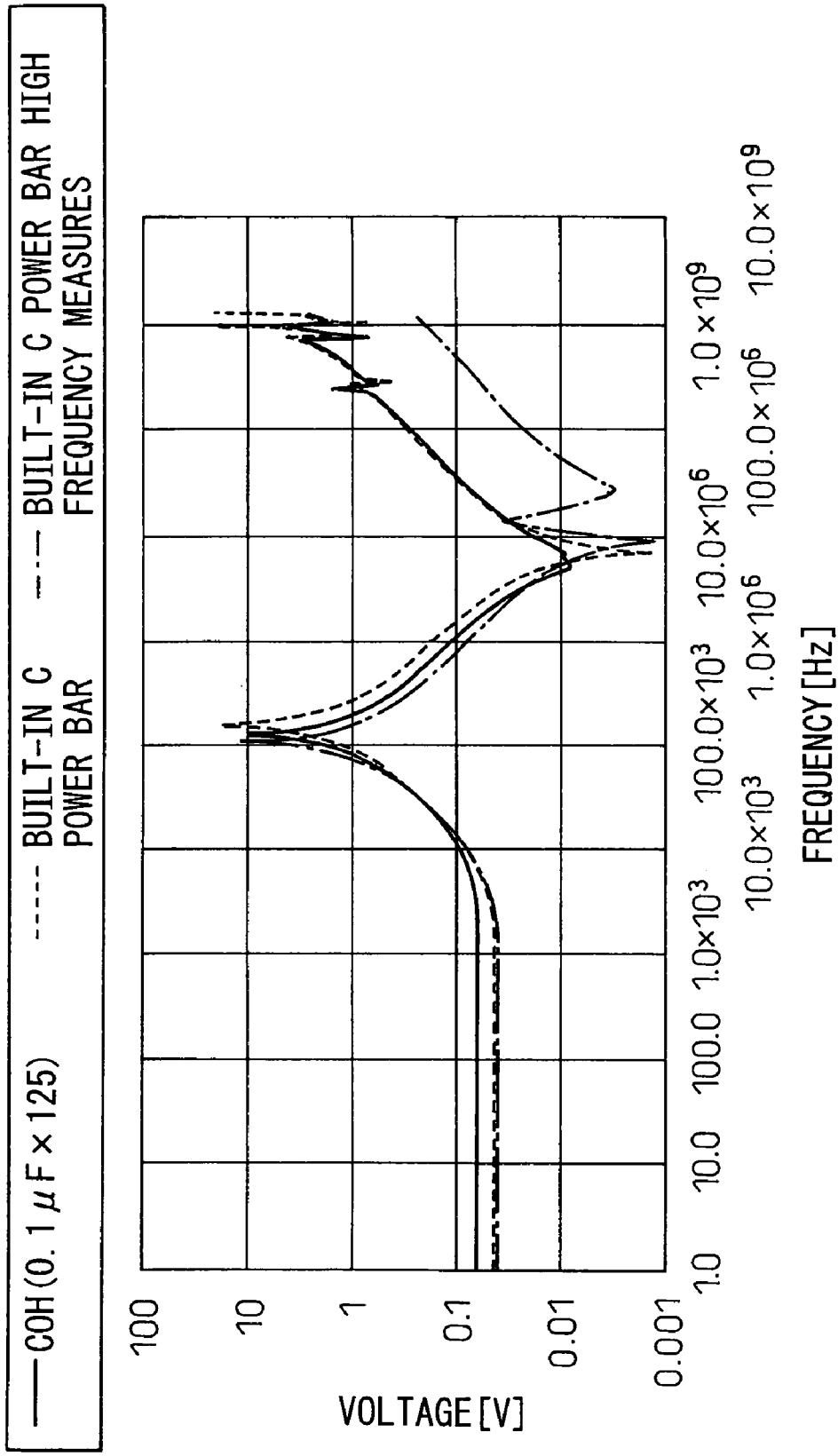

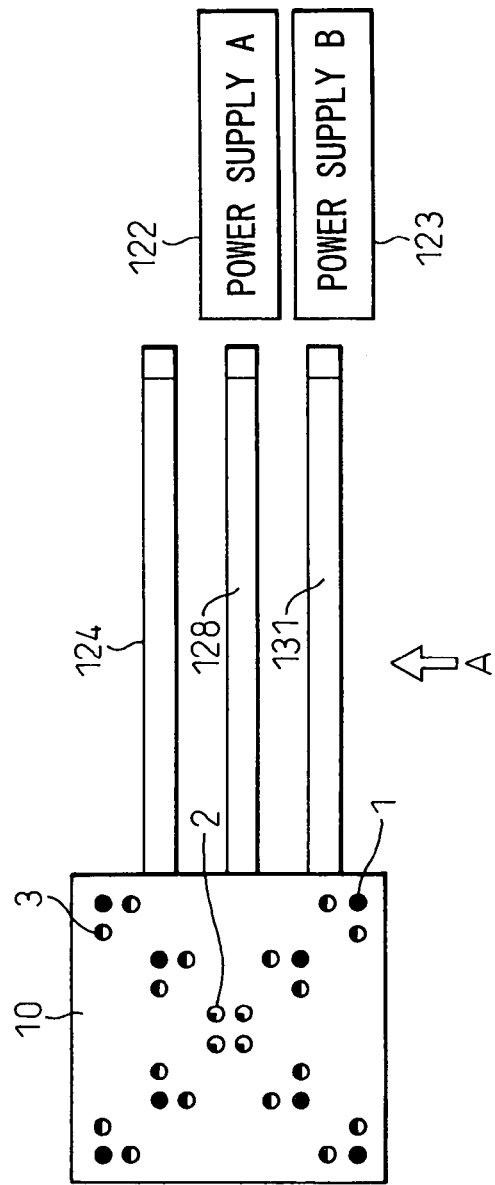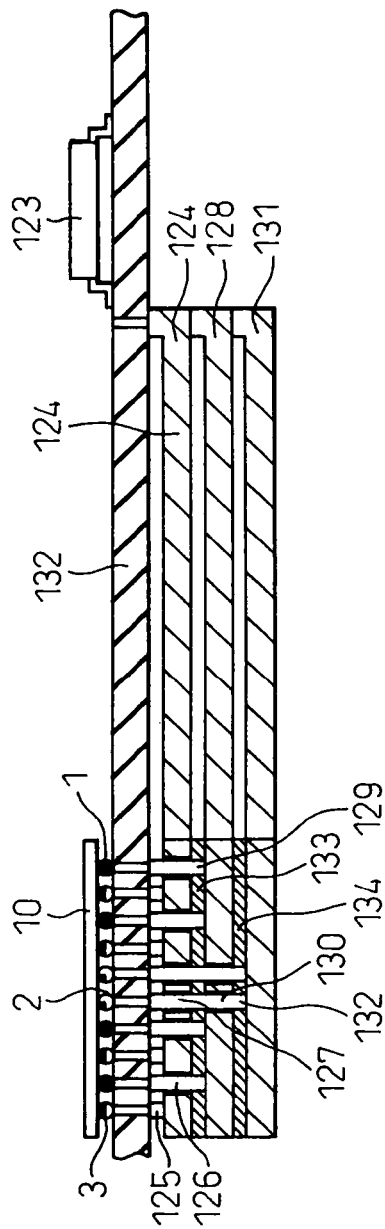

US 7,580,268 B2

BUILT-IN CAPACITOR TYPE POWER FEED DEVICE TO POWER PINS OF ELECTRICAL COMPONENT

CROSS-REFERENCE TO RELATED APPLICATIONS

This application is based upon and claims a priority of Japanese Patent Application No. 2005-286867 filed on Sep. 30, 2005, the contents of which being incorporated herein by reference.

BACKGROUND OF THE INVENTION

1. Field of the Invention

The present invention relates to a power feed device to power pins of an electrical component, more particularly relates to a built-in capacitor type power feed device designed to feed power to various types of power pins of a ball gate array (BGA) or other electrical component from an on board power (OBP) or other power supply without going through patterns included in the printed circuit board by arranging a power bar and ground bar outside of the printed circuit board, providing a high dielectric layer between them, and going through the power bar and ground bar.

2. Description of the Related Art

In recent years, the reduction in the noise margin of the power supply system accompanying the lower drive voltages of electrical components such as BGAs and the noise between the power and ground accompanying simultaneous switching waveforms are becoming major problems.

FIG. 1A is a plan view, seen from below, of a BGA fed with power by a conventional power feed device. In the figure, 10 indicates a BGA at the back side of which power pins 1 to 6 are arranged at predetermined positions in the row direction and column direction by solder balls. Each power pin 1 is an electrode supplied with for example a 3.3V power voltage $V_1$. Each power pin 2 is an electrode supplied with for example a 3.3V reference voltage $V_2$. Each power pin 3 is an electrode supplied with for example a 3.3V auxiliary power voltage $V_3$. Each power pin 4 is an electrode supplied with for example a 5V power voltage $V_4$. Each power pin 5 is an electrode supplied with for example a 5V reference voltage $V_5$. Each power pin 6 is an electrode supplied with for example a 5V auxiliary power voltage $V_6$.

FIG. 1B is a cross-sectional view showing one example of a conventional power feed device. In the figure, 12 indicates a printed circuit board arranged below the BGA 10, 13 indicates an OBP arranged on the printed circuit board 12 and generating a 3.3V voltage, 14 indicates an OBP arranged on the printed circuit board 12 and generating a 5V voltage, 15 indicates a copper foil power layer included in the printed circuit board 12 and forming a 3.3V power layer, 16 indicates a copper foil power layer included in the printed circuit board 12 and forming a 5V power layer, 17 indicates a via passing through the printed circuit board 12 for supplying the OBP 13 output voltage 3.3V to the power layer 15, 18 indicates a via passing through the printed circuit board 12 for supplying the OBP 14 output voltage 5V to the power layer 16, and 19 to 24 are vias passing through the printed circuit board 12 corresponding to the power pins 1 to 6. The bottom of the BGA 10 is shown by a cross-section along the dot-chain line of FIG. 1A. The 3.3V power layer 15 is connected through the vias 19 to 21 to the power pins 1 to 3, while the 5V power layer 16 is connected through the vias 22 to 24 to the power pins 4 to 6.

Instead of preparing the reference voltage $V_2$ inside the OBP 13, a voltage output from the other OBP 14 generating the 5V voltage is divided by a voltage division circuit (formed on the printed circuit board 12, but not shown) to prepare a 3.3V reference voltage $V_2$.

The BGA 10 is actually supplied with a plurality of types of power voltage and signals. For this reason, the printed circuit board 12 includes, though not shown, a plurality of other power layers and signal patterns.

FIG. 2 shows one example of a circuit included in the BGA. In the figure, 22 indicates a driver and 24 a receiver. The BGA has inside it a driver circuit and a receiver circuit. The driver and the receiver are connected by connecting different BGAs. A single BGA never has the driver and receiver connected inside it. If considering this by FIG. 2, 22 and 24 show the case of a different BGA driver circuit and receiver circuit connected by patterns on a printed circuit board. The driver 22 is supplied with the 3.3V power voltage $V_1$ and auxiliary power voltage $V_3$, while the receiver 24 is supplied with the 3.3V power voltage $V_1$. These power voltages are output from the OBP 13 and are supplied through the power layer 15 to the power pins 1 to 3.

FIG. 3 shows another example of a circuit included in the BGA. In the figure, 32 indicates a driver and 34 a receiver. The driver 32 is supplied with the 5V power voltage $V_4$ and the auxiliary power voltage $V_6$, while the receiver 34 is supplied with the 5V power voltage $V_5$. These power voltages are output from the OBP 14 and supplied through the power layer 16 to the power pins 4 to 6.

The reference voltage $V_2$ shown in FIG. 2 is used as the criteria for judgment as to if the output voltage of the driver 32 of the circuit shown in for example FIG. 3 is the high level or low level. For example, when the output voltage of the driver 32 is higher than 3.3V, it is judged that the voltage is the high level, while when it is 3.3V or less, it is judged as the low level.

For reference to this related art, see Japanese Patent Publication (A) No. 2-003957, Japanese Patent Publication (B) No. 7-120227, and Japanese Patent Publication (A) No. 6-223632.

In the case of a component like a BGA where a plurality of voltage power supplies are required, as shown in FIGS. 1A and 1B, the situation where the $V_1$, $V_2$, and $V_3$ are the same voltages, but the applications differ frequently occurs in practice. In this example, the driver-receiver power voltage $V_1$ of FIG. 2 is a voltage the same as the receiver reference voltage $V_2$ of FIG. 3. Further, physically, for example when using a 1 mm pitch BGA, since the distances between pins is in the narrow region of 1 mm, the pins are easily affected by each other in structure.

In the circuit of FIG. 2, when a current I flows through the driver 22, a noise in accordance with that current, that is, $V_n=LdI/dt$, occurs at the power bar 15 and as a result the power layer 15 fluctuates in voltage and the reference voltage $V_2$ fluctuates. This being the case, the reference voltage for judging if the output voltage of the driver 32 of the circuit shown in FIG. 3 is the high level or low level will fluctuate. For example, if the reference voltage $V_2$ changes to 3.5V and the output voltage of the driver 32 is 3.4V, while originally speaking the output of the driver 32 should be the high level, the change of this reference voltage causes it to be misjudged as the low level. Further, depending on the component, the component may also contain pins requiring an analog system power supply (PLL: phase-locked loop). In general, an analog system power supply is sensitive to noise, so for example even if the same voltage as the digital system power supply, physical separation is necessary. This is also one example where the voltages are the same, but the applications differ, so separation would be better.

Further, there were the problem that a printed circuit board included a large number of power layers and signal layers and therefore the number of conductor layers provided in the printed circuit board was large and the dimensions became larger and the problem that if trying to make the printed circuit board smaller in thickness, the conductor layers became greater in mounting density and production became difficult. For example, when the BGA 10 is a 1152-pin field programmable gate array (FPGA), there are 3.3V Vccaux pins (eight pins), but specification-wise, these Vccaux pins have to be activated before all of the other power supplies (Vcc and Vref). For this reason, in the past, two separate layers, that is, a Vccaux power layer and a Vcco and Vref power layer, were necessary.

SUMMARY OF THE INVENTION

An object of the present invention is to solve the problem of the reduction in the noise margin of the power supply system accompanying the lower drive voltages of electrical components such as BGAs and the noise between the power supply and the ground accompanying simultaneous switching waveforms.

Another object of the present invention is to reduce the mounting density of the conductor layers included in the printed circuit board in a power feed device or reduce the thickness of the printed circuit board and thereby realize a smaller size.

To achieve the above objects, the first aspect of the present invention provides a built-in capacitor type power feed device for an electrical component, comprising a power supply for supplying power, a printed circuit board including a signal line pattern, a power bar having conductive projections provided in shapes and at positions corresponding to the shapes and positions of electrodes of the electrical component and provided outside of the printed circuit board, a ground bar provided outside of the printed circuit board, and a high dielectric layer provided at a part corresponding to the electrical component between the power bar and the ground bar, power from the power supply being fed to electrodes of the electrical component through the power bar and the ground bar.

According to the first aspect of the present invention, since the power bar and the ground bar are provided outside of the printed circuit board and a high dielectric layer is provided between the power bar and the ground bar, it is possible to reduce the mounting density of the printed circuit board or simplify the production of the printed circuit board. Further, since the power bar, high dielectric layer, and ground bar form a capacitor, a built-in capacitor type power feed device can be realized.

According to a second aspect of the present invention, the electrical component is provided with ground use ground pins and power pins, the power bar is provided with holes provided at positions corresponding to the ground pins and insulated at their surroundings from the power bar and first conductive projections provided at positions corresponding to the power pins, the ground bar is provided with second conductive projections fitting into the holes, the first conductive projections are connected to the power pins of the electrical component through vias in the printed circuit board, and the second conductive projections are connected to the ground pins of the electrical component through other vias in the printed circuit board.

According to the second aspect of the present invention, since the power bar, high dielectric layer, and ground bar are provided below the printed circuit board in that order, in the built-in capacitor type power feed device, the power bar and ground bar are free from the effects of voltage fluctuations in a power layer in the printed circuit board, therefore the quality of transmission of signals in the electrical component can be improved.

According to a third aspect of the present invention, the electrical component is provided with ground use ground pins and power pins, the ground bar is provided with first conductive projections provided at positions corresponding to the ground pins and holes provided at positions corresponding to the power pins and insulated at their surroundings from the ground bar, the power bar provided with second conductive projections fitting into the holes, the first conductive projections are connected to the ground pins of the electrical component through vias in the printed circuit board, and the second conductive projections are connected to the power pins of the electrical component through other vias in the printed circuit board.

According to the third aspect of the present invention, since the ground bar, high dielectric layer, and power bar are provided below the printed circuit board in that order, in the built-in capacitor type power feed device, the power bar and ground bar are free from the effects of voltage fluctuations in a power layer in the printed circuit board, therefore the quality of transmission of signals in the electrical component can be improved.

According to a fourth aspect of the present invention, the power bar and the ground bar are provided between the printed circuit board and the electrical component, and the power bar and the ground bar are directly connected to the electrical component without going through vias of the printed circuit board.

According to the fourth aspect of the present invention, since the power bar and ground bar are directly connected to the electrical component without going through vias of the printed circuit board, compared with the case of connection through vias, the effect of high frequency noise can be reduced.

According to a fifth aspect of the present invention, there are a plurality of power bars and there are a plurality of ground bars provided between the plurality of power bars sandwiching high dielectric layers.

According to the fifth aspect of the present invention, even when there are a plurality of power supplies, since high dielectric layers are provided between the power bars and ground bars corresponding to these plurality of power supplies, it is possible to further reduce the mounting density of the printed circuit board, realize further simplification of the production of the printed circuit board, and realize a built-in capacitor type power feed device for a plurality of power supplies.

According to the sixth aspect of the present invention, the power bar and the ground bar are provided between the printed circuit board and the electrical component, the power pins and ground pins of the electrical component are directly connected to the power bar and the ground bar without going through vias of the printed circuit board, and the power bar and the ground bar are also connected to vias of the printed circuit board.

BRIEF DESCRIPTION OF THE DRAWINGS

These and other objects and features of the present invention will become clearer from the following description of the preferred embodiments given with reference to the attached drawings, wherein:

FIG. 1A is a plan view, as seen from below, of a BGA fed with power by a conventional power feed device, while

FIG. 9 is a graph of the frequency characteristics of a conventional COH configuration power feed device, a built-in capacitor type power feed device according to Example 1 of the present invention shown in FIGS. 4A to 4D, and a power feed device of the built-in capacitor type shown in FIG. 5 and given measures against high frequency;

FIG. 10A to 10D are plan views of a built-in capacitor-type power feed device according to Example 6 of the present invention, wherein FIG. 10A is a plan view of a BGA 10, FIG. 10B is a plan view of a power supply A side power bar, FIG. 10C is a plan view of a ground side power bar, and FIG. 10D is a power supply B side power bar; and FIG. 11A is a plan view of a multi-power supply power bar shown in FIGS. 10A to 10D, while FIG. 11B is a cross-sectional view of a multi-power supply power bar.

DESCRIPTION OF THE PREFERRED EMBODIMENTS

Below, preferred embodiments of the invention will be explained in detail with reference to the attached drawings.

Example 1

Figure 4A:
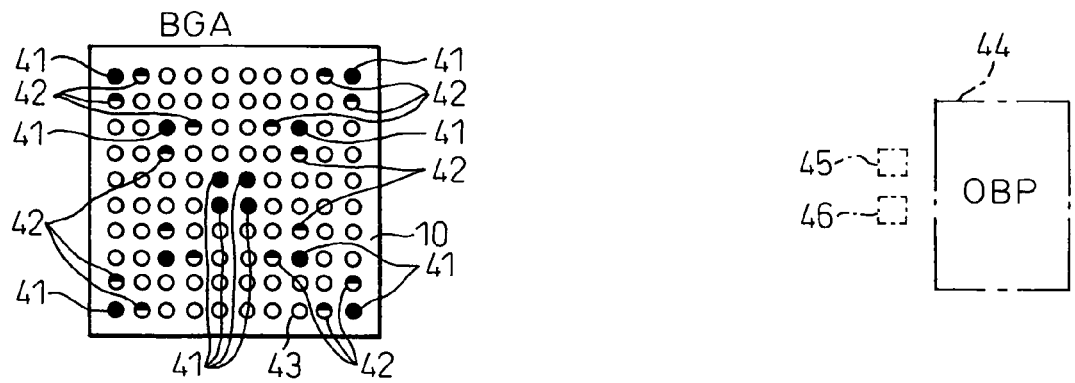
FIGS. 4A to 4D are views for explaining the basic configuration of a built-in capacitor-type power feed device according to Example 1 of the present invention.

FIGS. 4A to 4D are views explaining the basic configuration of a built-in capacitor type power feed device according to Example 1 of the present invention. FIG. 4A is the same as the conventional view shown in FIG. 1A viewing the BGA 10 from the back. In the figure, the circles 41 shown by the black dots are ground use ground pins, the circles 42 half filled in with black indicate the power pins 42, and the circles indicated by 43 indicate the signal pins. These pin are formed by solder balls at the back surface of the BGA 10. Reference numeral 44 shown at the right of the BGA 10 in the figure is an OBP, while reference numerals 45 and 46 shown by dotted lines indicate conductive patterns formed at the back surface of the printed circuit board 50 (see FIG. 4D) for electrical contact with the power bar 48 or ground bar 49.

Figure 4B:
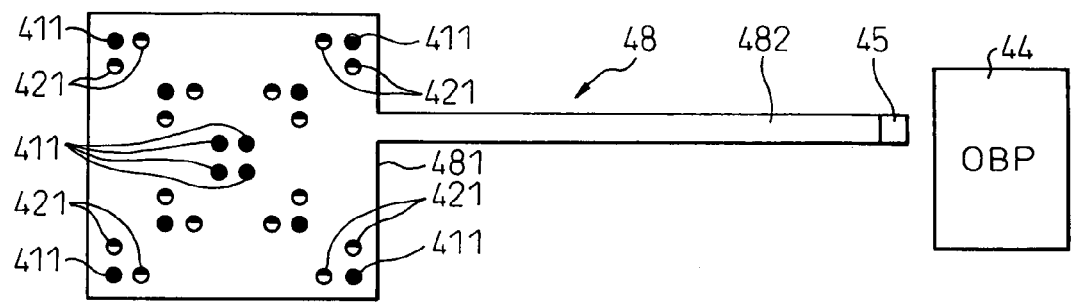

FIG. 4B is a plan view of a power bar 48. As illustrated, the power bar 48 is comprised of a main body part 481 of substantially the same shape as the BGA 10 and a bar part 482. The width of the bar part 482 is shown as being narrower than the width of the main body part 481, but does not necessarily have to be narrower. It may also be made wider when there is a reason such as keeping the voltage drop low, increasing the capacity of the capacitor, etc. The main body part 481 is provided with holes 411 provided at positions corresponding to the ground pins 41 of the BGA 10 and cylindrical conductive projections 421 provided at positions corresponding to the power pins 42 of the BGA 10. The conductive projections 421 are not limited in shape to cylinders. The holes 411 are coated around them with an insulating material, preferably a high dielectric, so as to be electrically insulated from the power bar 48.

Figure 4C:
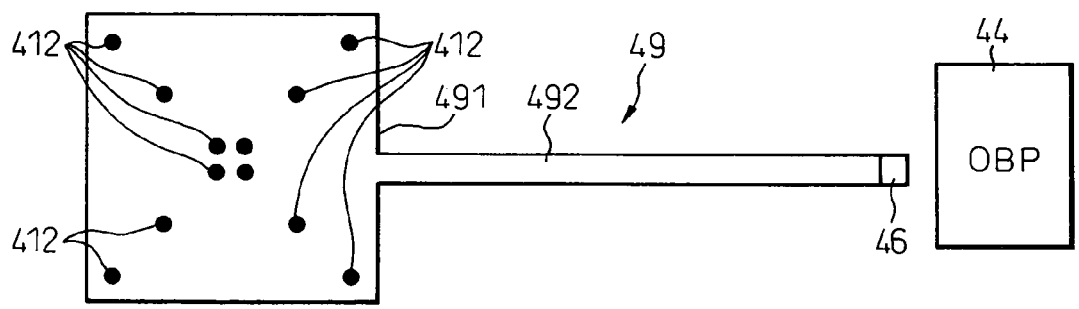

FIG. 4C is a plan view of the ground bar 49. As illustrated, the ground bar 49 is also comprised of a main body part 491 of substantially the same shape as the BGA 10 and a bar part 492. The width of the bar part 492 is shown as being narrower than the width of the main body part 491, but does not necessarily have to be narrower. It may also be made wider when there is a reason such as keeping the voltage drop low, increasing the capacity of the capacitor, etc. The main body part 491 is provided with conductive projections 412 provided at positions corresponding to the ground pins 41 of the BGA 10. The conductive projections 412 are not limited in shape to cylinders. The holes 411 of the power bar 48 are made somewhat larger than the conductive projections 412 of the ground bar 49. They are designed so that when the power bar 48 and the ground bar 49 are overlaid, the conductive projections 412 fit tightly into the holes 411.

Figure 4D:
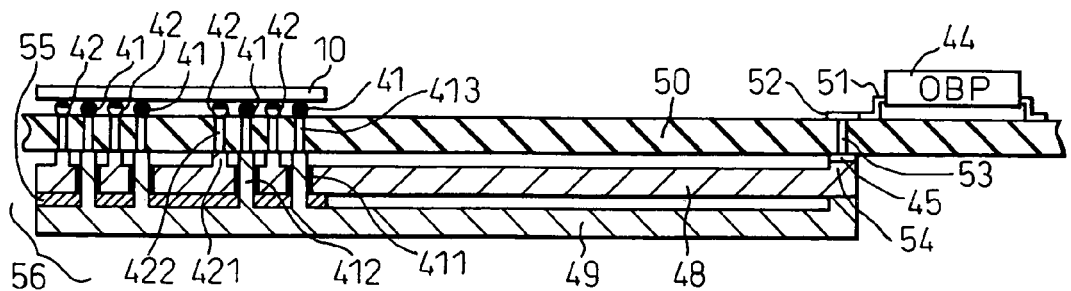

FIG. 4D is a cross-sectional view of a built-in capacitor type power feed device according to Example 1. As illustrated, the output power pin 51 of the OBP 44 arranged at the right side of the printed circuit board 50 in the illustration is electrically connected to the conductive projections 54 of the power bar 48 through the conductive pattern 52 formed on the printed circuit board 50, the via 53 passing through the printed circuit board 50, and the conductive pattern 45.

The BGA 10 is mounted at on the printed circuit board 50 at the left side in the illustration. The ground pins 41 of the BGA 10 are connected to the ground bar 49 through vias 413 passing through the printed circuit board 50 and conductive projections 412 fit in holes 411 of the power bar 48. The holes 411 are formed at their surroundings with electrical insulating materials or spaces are provided from the power bar 48 to insulate them from the power bar 48. The main body part 491 of the ground bar 49 is connected through the bar part 492 to the ground pins of the OBP 44 through conductive projections, vias, and conductive patterns formed at the bottom side of the printed circuit board 50 (in the figure, hidden since at back of power bar 49).

The power pins 42 of the BGA 10 are electrically connected to the power bar 48 through other vias 422 passing through the printed circuit board 50 and conductive projections 421 of the power bar 48.

The main body part 481 of the power bar 48 and the main body part 491 of the ground bar 49 are provided between them, according to the present invention, with a high dielectric layer 55. The main body part 481, high dielectric layer 55, and main body part 491 form a capacitor 56. Due to this, a built-in capacitor type power feed device is formed. This built-in capacitor type power feed device realizes substantially the same noise performance as the case of mounting 125 0.1 μF capacitors by chip on hole (COH) configuration. By realizing such a built-in capacitor type power feed device, it is no longer necessary to separately provide any capacitor for removal of high frequency noise in the power feed device.

The BGA 10 and the OBP 44 are mounted by an ordinary reflow process on the printed circuit board 50. The power bar 48 and ground bar 49 can also be similarly mounted, but if the power bar or ground bar is thick or when large in volume, it will become larger in heat capacity and may conceivably be hard to raise in temperature by the reflow heat. In this case, the power bar 48 and ground bar 49 may be fastened to the printed circuit board 50 by screws etc. The parts of the printed circuit board 50 other than the not shown signal layers and power layers are insulators.

According to the basic configuration of the built-in capacitor type power feed device shown in FIGS. 4A to 4D, since the power bar and ground bar are provided outside of the printed circuit board 50, it becomes possible to reduce the number of the power layers inside the printed circuit board 50. Further, by sandwiching a high dielectric layer 55 between the power bar 48 and the ground bar 49, it is possible to realize a large capacity capacitor in the power feed device and it is no longer necessary to mount a large number of capacitors such as with a COH configuration.

Example 2

In Example 1, the power bar 48 was arranged under the printed circuit board 50, the high dielectric layer 55 was provided under that, and the ground bar 49 was arranged under that, but it is also possible to reverse the positional relationship between the power bar and ground bar. That is, it is also possible to arrange the ground bar 49 under the printed circuit board 50, provide the high dielectric layer 55 under that, and arrange the power bar 48 under that. In this case, first conductive projections are provided at positions corresponding to the ground pins 41 of the ground bar 49 and holes are provided at positions corresponding to the power pins 42. Further, the power bar 48 is provided with second conductive projections fitting into holes provided at the ground bar 49. Further, the first conductive projections may be connected to the ground pins of the electrical component through vias in the printed circuit board, while the second conductive projections may be connected to power pins of the electrical component through other vias in the printed circuit board.

Example 3

Figure 5:
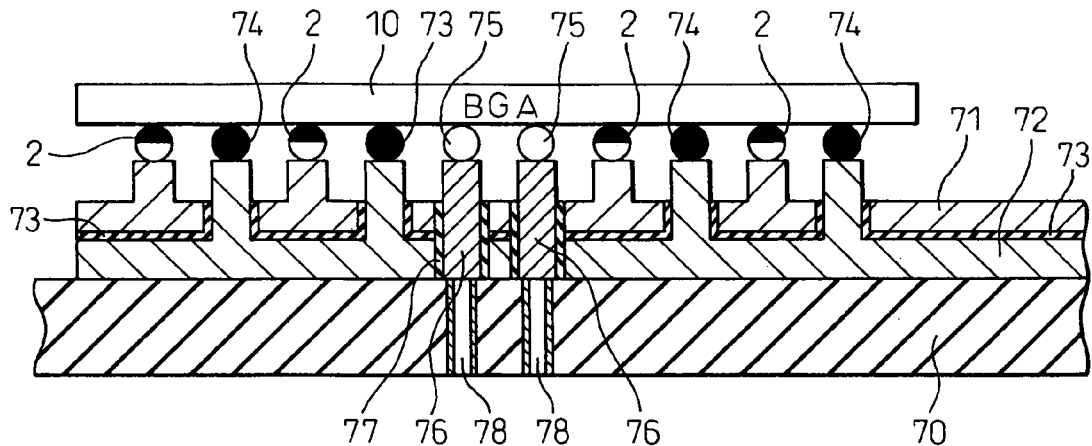
FIG. 5 is a cross-sectional view of a built-in capacitor-type power feed device according to Example 3 of the present invention.

FIG. 5 is a cross-sectional view of a built-in capacitor type power feed device according to Example 3 of the present invention. In Example 3, a power bar 71 and ground bar 72 are provided between the BGA 10 and the printed circuit board 70. The power bar 71 and the ground bar 72 are electrically separated by a high dielectric layer 73. The BGA 10 is provided with not only power pins 2, but also ground use power pins 74 and signal transmission use signal pins 75. Reference numeral 76 shows connection pins for connecting the signal pins 75 to a signal layer (not shown) included in the printed circuit board 70, while 77 shows insulators for electrically insulating the signal pins 75 from the power bar 71 and ground bar 72. The connection pins 76 are cylindrically shaped, while the insulators 77 are shaped as hollow tubes able to surround them. The signal pins 75 of the BGA 10 are connected through connection pins 76 passing through the power bar 71 and insulation layer 73 and ground bar 72 to the vias 78. The power bar 71, ground bar 72, and high dielectric layer 73 are formed with holes for passage of the signal pins 76. The vias 78 are connected with a signal layer (not shown) in the printed circuit board 70. The connection pins 76 are connected to the vias 78 by reflow soldering, or the power bar 71 and ground bar 72 themselves are fastened by screws (not shown) to the printed circuit board 70 for connection to the signal layer included in the printed circuit board 70.

Due to this configuration, a high dielectric layer is sandwiched between the power bar and ground bar enabling realization of a built-in capacitor type power feed device, while the power bar and ground bar are directly connected to the BGA 10 without going through vias of the printed circuit board, so there is an effect of reduction of the high frequency noise.

In general, vias in a printed circuit board have large inductances in the high frequency region and pose major problems even when the printed circuit board is at most 2 mm or so in thickness. As a measure against high frequency noise, in general a capacitor is mounted in the circuit in the printed circuit board. According to the present embodiment, however, since the state is the same as if mounting a capacitor directly under the BGA 10 and the power bar is directed connected to the BGA 10 without going through the printed circuit board, this is extremely effective as a measure against high frequency noise.

Example 4

Figure 6:
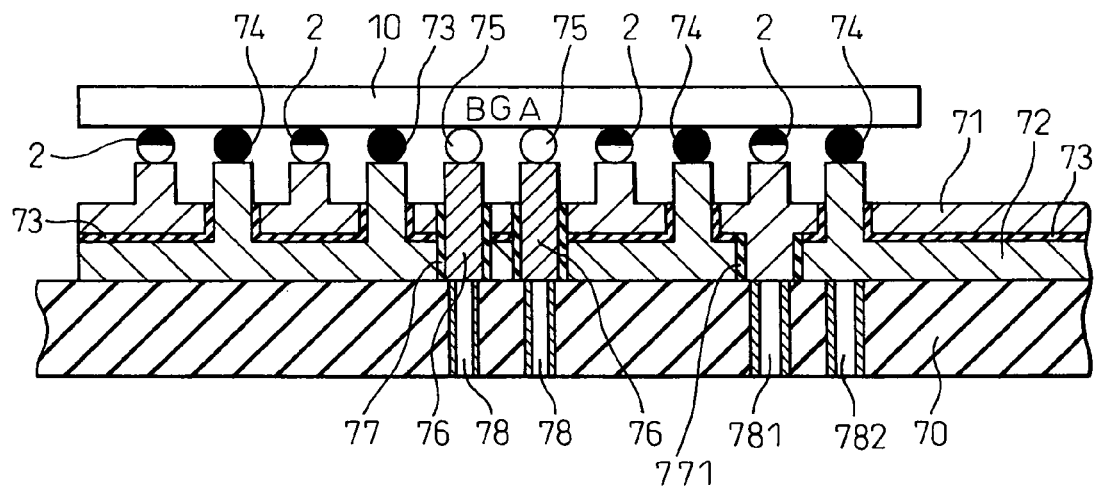
FIG. 6 is a cross-sectional view of a built-in capacitor-type power feed device according to Example 4 of the present invention.

FIG. 6 is a cross-sectional view of a built-in capacitor type power feed device according to Example 4 of the present invention. In the figure, parts the same as in FIG. 5 are assigned the same reference numerals and explanations are omitted. The differences from FIG. 5 are that in FIG. 6, the power bar 71 is not only connected to the power pins 2, but is also connected to a via 781 passing through the printed circuit board 70 and that the ground bar 72 is not only connected to the ground use power pins 74, but is also connected to a via 782 passing through the printed circuit board 70. Reference numeral 771 is an insulator. While not shown in FIG. 6, the printed circuit board 70 includes a power layer and ground layer. The via 781 is electrically connected to this power layer, while the via 782 is electrically connected to this ground layer. Due to this, the power bar 71 and the power layer in the printed circuit board 70 are connected in parallel and the ground bar 73 and the ground layer in the printed circuit board 70 are connected in parallel, so the effect due to the voltage drop can be reduced.

Example 5

Figure 7:
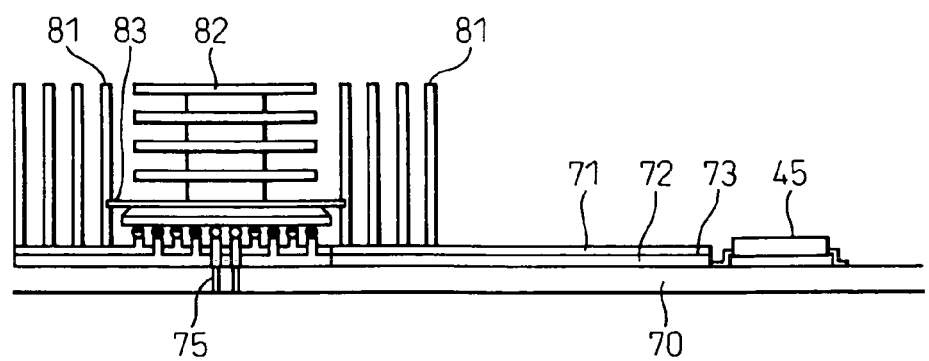
FIG. 7 is a cross-sectional view of a built-in capacitor-type power feed device according to Example 5 of the present invention.

FIG. 7 is a cross-sectional view of a built-in capacitor type power feed device according to Example 4 of the present invention. In the figure, parts the same as in FIG. 5 are assigned the same reference numerals, and explanations are omitted. A power bar 71 is made from copper or another metal originally having a high electric conductivity, so by providing part of the power bar 71 with at least one of plate type heat radiating fins 81 and disk type heat radiating fins 82, it is possible to obtain a heat radiating structure. Further, if providing part of the plate type heat radiating fins 81 with slits 83 to enable part of the disk type heat radiating fins 82 to slide, a further larger heat radiating effect is obtained.

Figure 8:
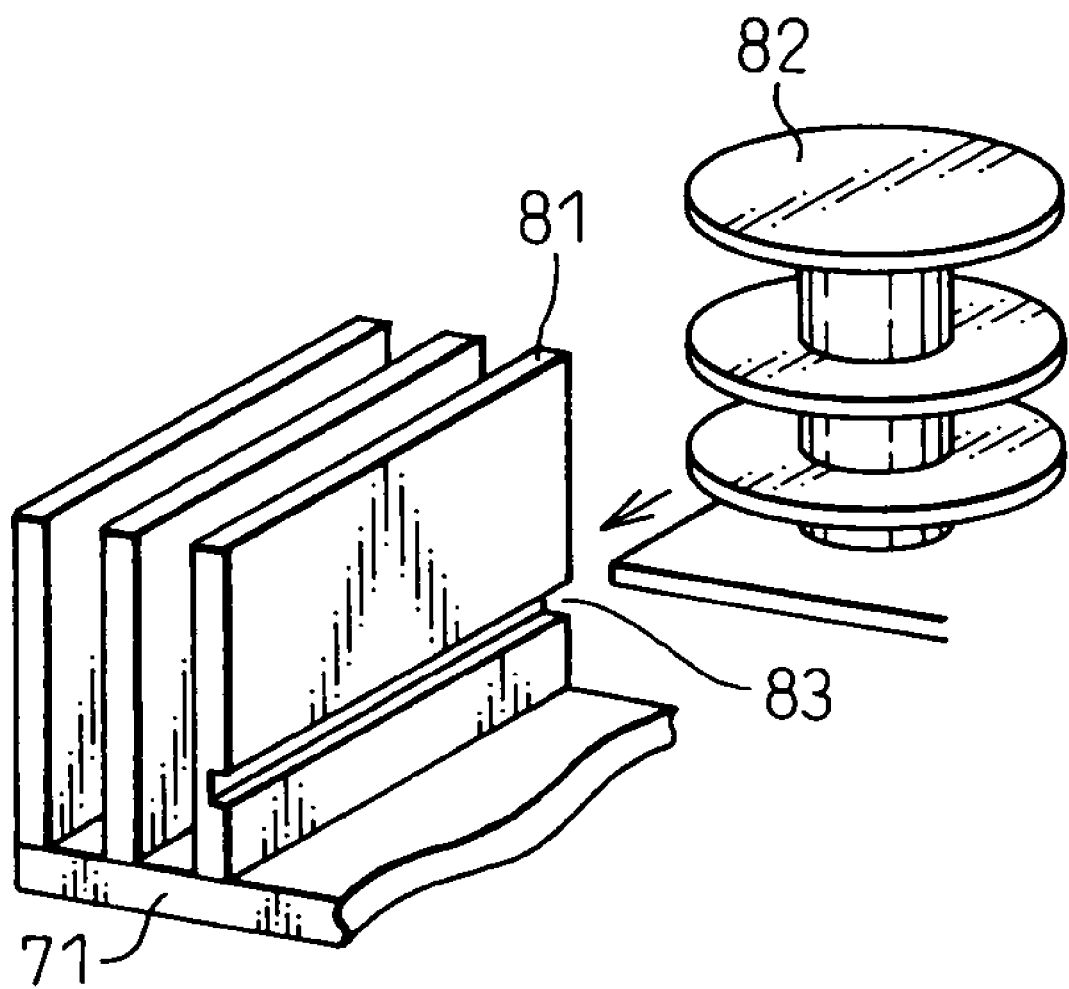
FIG. 8 is an enlarged view showing part of FIG. 7.

FIG. 8 is an enlarged view showing an example of providing part of the plate type heat radiating fins 81 explained in FIG. 7 with slits 83 to enable part of the disk type heat radiating fins 82 to slide.

FIG. 9 is a graph of the frequency characteristics of a conventional COH configuration power feed device, a built-in capacitor type power feed device according to Example 1 of the present invention shown in FIGS. 4A to 4D, and a power feed device of the built-in capacitor type shown in FIG. 5 and given measures against high frequency. In the figure, the solid line curve shows the frequency characteristic of the COH configuration, the dotted line curve the frequency characteristic of a built-in capacitor type power bar, and the dot-chain line curve the frequency characteristic of a power bar of the built-in capacitor type given measures against high frequency. As illustrated, near 10 MHz, compared with the frequency characteristic of the COH configuration, the frequency characteristic of the built-in capacitor type power bar shown in FIGS. 4A to 4D and the frequency characteristic of the power bar of the built-in capacitor type shown in FIG. 5 given measures against high frequency can be suppressed in noise to the single digit level. Further, at 10 MHz to 1 GHz high frequency, the frequency characteristic of the power bar of the built-in capacitor type shown in FIG. 5 given measures against high frequency, compared with the frequency characteristic of the COH configuration and the frequency characteristic of the built-in capacitor type power bar, can be suppressed in noise to the single digit level.

Example 6

Figure 10A:
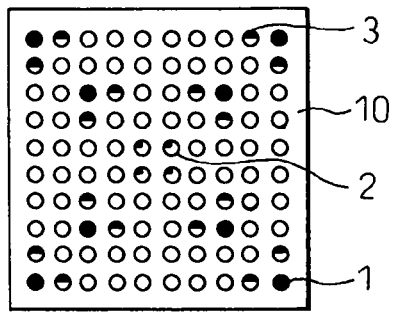
Figure 10B:
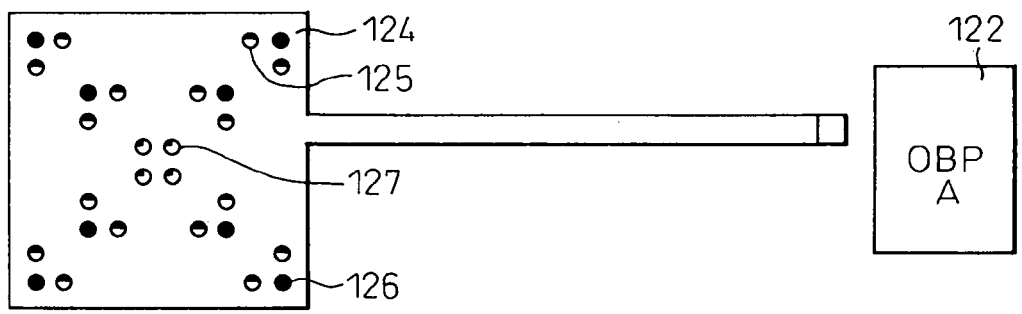
Figure 10C:
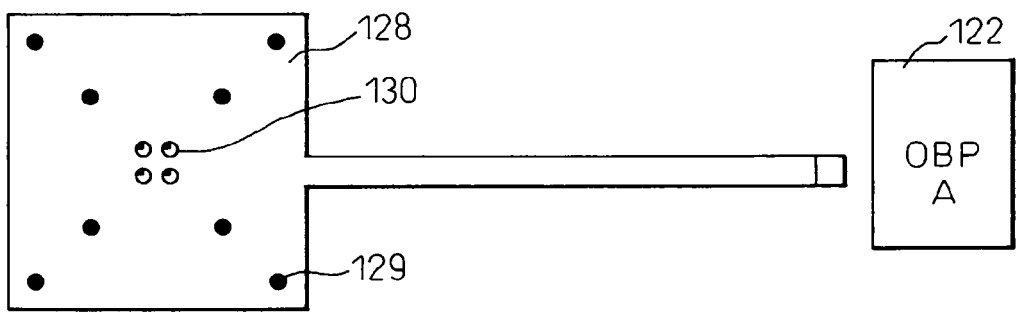
Figure 10D:
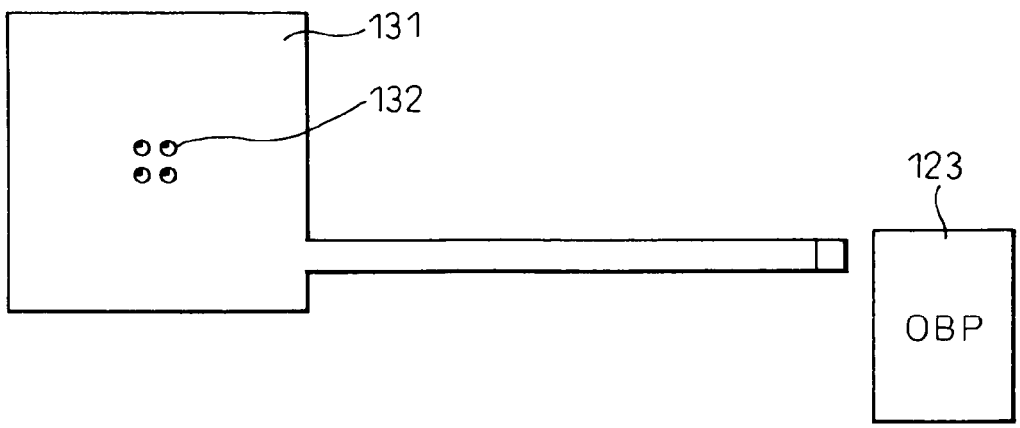

FIGS. 10A to 10D are plan views of a built-in capacitor type power feed device according to Example 6 of the present invention. In the figures, FIG. 10A is a plan view of a BGA 10, FIG. 10B is a plan view of a power supply A side power bar, FIG. 10C is a plan view of a ground side power bar, and FIG. 10D is a plan view of a power supply B side power bar. In this way, in the present example, a single BGA has two power supplies 122 (A) and 123 (B) connected to it.

Figure 1A:
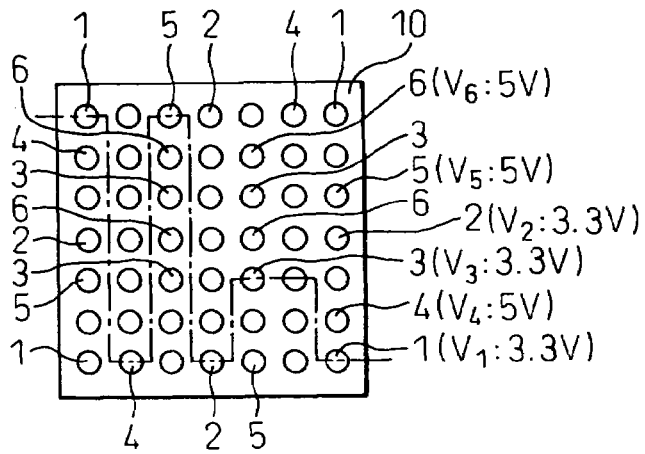
Figure 1B:
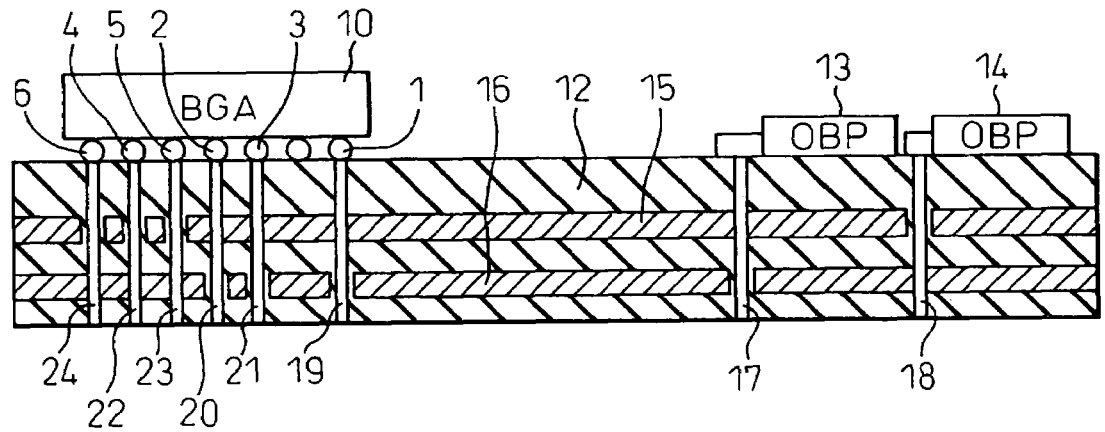
FIG. 1B is a cross-sectional view showing an example of a conventional power feed device.
Figure 2:
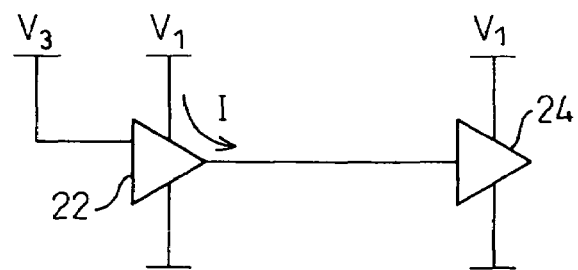
FIG. 2 shows an example of a circuit included in the BGA.
Figure 3:
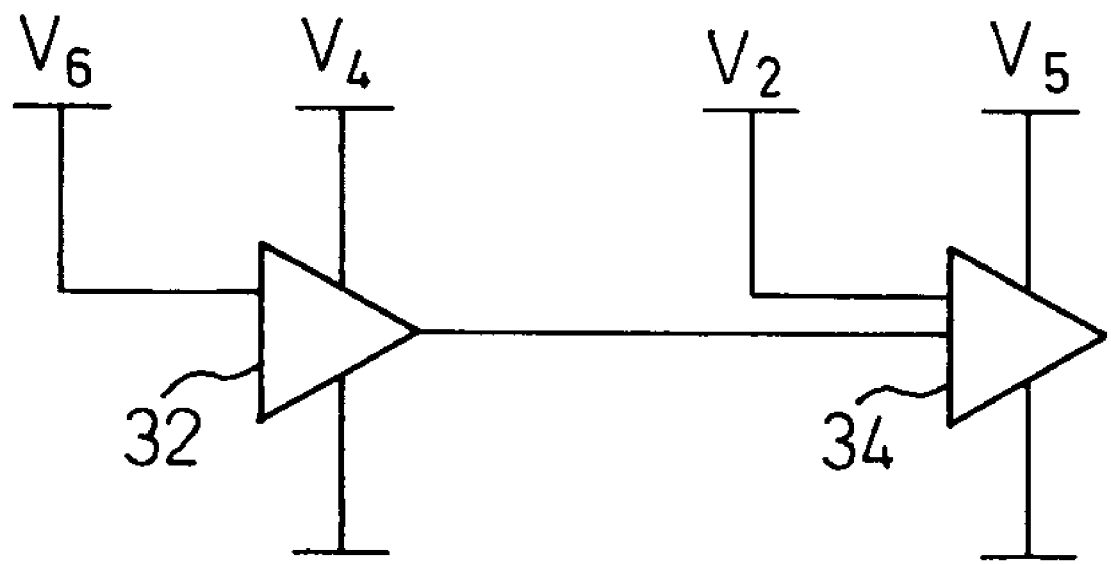
FIG. 3 shows another example of a circuit included in the BGA.

The BGA 10 shown in FIG. 10A is the same as that shown in FIGS. 1A and 1B and is provided with ground pins 1, power pins 2, and power pins 3.

In FIG. 10B, 124 indicates a power bar connected to a power supply A side 122 and provided at its main body part with cylindrical conductive projections 125 corresponding to the power pins 3, holes 126 corresponding to the ground pins 1, and holes 127 corresponding to the power pins 2.

In FIG. 10C, 128 indicates a ground side power bar connected to the power supply A side 122 and provided at its main body part with cylindrical conductive projections 129 corresponding to the ground pins 1 and holes 130 corresponding to the power pins 2.

In FIG. 10D, 131 indicates a power bar connected to the power supply B side 123 and provided at its main body part with cylindrical conductive projections 132 corresponding to the power pins 2. By superposing these three power bars 124, 128, and 131, a multi-power supply power bar can be realized.

FIG. 11A is a plan view of the multi-power supply power bar shown in FIG. 10A to 10D, while FIG. 11B is a cross-sectional view of a multi-power supply power bar as seen from the arrow A direction in FIG. 11A. As will be understood from FIG. 11A, the bar parts of the power bars are arranged offset in the lateral direction. In FIG. 11B, 133 indicates a high dielectric layer between the power bar 124 and the main body part of the power bar 128, and 134 indicates a high dielectric layer between the power bar 128 and the main body part of the power bar 131. In the example shown in FIGS. 10A to 10D and FIGS. 11A and 11B, the case of two power supplies is shown, but even if the number of power supplies is three or more, this can be similarly dealt with by adding power bars under the printed circuit board 132 and holes in the power bars superposed with the same.

As clear from the above explanation, according to the present invention, by arranging the power bar and ground bar outside of the printed circuit board and providing a high dielectric layer sandwiched between the power bar and ground bar, it is possible to reduce the number of power layers included in the printed circuit board and reduce the mounting density of the printed circuit board or simplify the production of the printed circuit board and realize a built-in capacitor type power feed device. Further, the power bar is free from the effects of voltage fluctuations of a power layer in the printed circuit board, therefore it is possible to improve the quality of transmission of the signals in the electrical component. Further, by having the power bar directly connected to the electrical component without going through vias of the printed circuit board, it is possible to reduce the effects of high frequency noise compared with the case of connection through vias. Further, since the power bar is insulated from the power layer in the printed circuit board, the power bar is free from the effects of voltage fluctuations in the power layer in the printed circuit board, therefore it is possible to improve the quality of transmission of the signals in the electrical component. Further, even when there are a plurality of power supplies, since a plurality of power bars corresponding to the plurality of power supplies are provided outside of the printed circuit board, it is possible to further reduce the mounting density of the printed circuit board and further simplify the production of the printed circuit board.

While the invention has been described with reference to specific embodiments chosen for purpose of illustration, it should be apparent that numerous modifications could be made thereto by those skilled in the art without departing from the basic concept and scope of the invention.

The invention claimed is:

1. A built-in capacitor type power feed device for an electrical component, comprising:
    a power supply supplying power;
    a printed circuit board including a signal line pattern;
    a power bar having a main body of substantially the same shape as said electrical component and having conductive projections provided at positions corresponding to positions of electrodes of said electrical component, said power bar being provided outside of said printed circuit board;
    a ground bar provided outside of said printed circuit board and separated from said printed circuit board; and
    a high dielectric layer provided at a part corresponding to said electrical component between said power bar and said ground bar, power from said power supply being fed to electrodes of said electrical component through said power bar and said ground bar, wherein
    said electrical component comprises ground use ground pins and power pins,
    said power bar is provided with holes provided at positions corresponding to said ground pins and insulated at their surroundings from said power bar and first conductive projections provided at positions corresponding to said power pins,
    said ground bar is provided with second conductive projections fitting into said holes,
    said first conductive projections are connected to said power pins of said electrical component through vias in said printed circuit board, and
    said second conductive projections are connected to said ground pins of said electrical component through other vias in said printed circuit board.

2. A built-in capacitor type power feed device for an electrical component, comprising:
    a power supply supplying power;
    a printed circuit board including a signal line pattern;
    a power bar having a main body of substantially the same shape as said electrical component and having conductive projections provided at positions corresponding to positions of electrodes of said electrical component, said power bar being provided outside of said printed circuit board;
    a ground bar provided outside of said printed circuit board and separated from said printed circuit board; and a high dielectric layer provided at a part corresponding to said electrical component between said power bar and said ground bar, power from said power supply being fed to electrodes of said electrical component through said power bar and said ground bar, wherein said electrical component comprises ground use ground pins and power pins, said ground bar is provided with first conductive projections provided at positions corresponding to said ground pins and holes provided at positions corresponding to said power pins and insulated at their surroundings from said ground bar, said power bar provided with second conductive projections fitting into said holes, said first conductive projections are connected to said ground pins of said electrical component through vias in said printed circuit board, and said second conductive projections are connected to said power pins of said electrical component through other vias in said printed circuit board.

3. A built-in capacitor type power feed device for an electrical component, comprising:

a power supply supplying power;

a printed circuit board including a signal line pattern;

a power bar having a main body of substantially the same shape as said electrical component and having conductive projections provided at positions corresponding to positions of electrodes of said electrical component, said power bar being provided outside of said printed circuit board;

a ground bar provided outside of said printed circuit board and separated from said printed circuit board; and a high dielectric layer provided at a part corresponding to said electrical component between said power bar and said ground bar, power from said power supply being fed to electrodes of said electrical component through said power bar and said ground bar, wherein said power bar and said ground bar are provided between said printed circuit board and said electrical component, and said power bar and said ground bar are directly connected to said electrical component without going through vias of said printed circuit board.

4. A built-in capacitor type power feed device for an electrical component, comprising:

a power supply supplying power;

a printed circuit board including a signal line pattern;

a power bar having a main body of substantially the same shape as said electrical component and having conductive projections provided at positions corresponding to positions of electrodes of said electrical component, said power bar being provided outside of said printed circuit board;

a ground bar provided outside of said printed circuit board and separated from said printed circuit board; and a high dielectric layer provided at a part corresponding to said electrical component between said power bar and said ground bar, power from said power supply being fed to electrodes of said electrical component through said power bar and said ground bar, wherein said power bar and said ground bar are provided between said printed circuit board and said electrical component, the power pins and ground pins of said electrical component are directly connected to said power bar and said ground bar without going through vias of said printed circuit board, and said power bar and said ground bar are also connected to vias of said printed circuit board.

* * * * *